(12) United States Patent
Kobayashi

(10) Patent No.: US 7,608,992 B2
(45) Date of Patent: Oct. 27, 2009

(54) DEVICE FOR DISPLAYING IMAGES ON ITS FRONT AND BACK SURFACES

(75) Inventor: Michiya Kobayashi, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 334 days.

(21) Appl. No.: 10/526,007

(22) PCT Filed: Aug. 27, 2003

(86) PCT No.: PCT/JP03/10850

§ 371 (c)(1),
(2), (4) Date: Oct. 31, 2005

(87) PCT Pub. No.: WO2004/026001

PCT Pub. Date: Mar. 25, 2004

(65) Prior Publication Data

US 2006/0139268 A1      Jun. 29, 2006

(30) Foreign Application Priority Data

Aug. 28, 2002  (JP) .............................. 2002-248942

(51) Int. Cl.
*G09G 3/36* (2006.01)
*G06F 3/03* (2006.01)
*H05B 33/00* (2006.01)
*G09G 3/02* (2006.01)

(52) U.S. Cl. .................. 313/503; 345/104; 345/87; 178/20.01; 313/504; 313/506; 313/512

(58) Field of Classification Search .......... 313/582–586

See application file for complete search history.

(56) References Cited

U.S. PATENT DOCUMENTS 5,581,274 A * 12/1996 Tagawa ...................... 345/104

(Continued)

FOREIGN PATENT DOCUMENTS

EP       0 881 617 A1   12/1998

(Continued)

OTHER PUBLICATIONS

Ono, Yoshiyuki, Japanese Patent Application 2001-305525, Oct. 2001, machine translation.*

(Continued)

*Primary Examiner*—Sikha Roy
*Assistant Examiner*—Tracie Y Green
(74) *Attorney, Agent, or Firm*—Pillsbury Winthrop Shaw Pittman, LLP

(57) ABSTRACT

An organic electro-luminescence display device includes first pixels formed aver an optically transparent substrate, each of the first pixels including a first organic electro-luminescence element, which includes a first optically transparent and electrically conductive layer, an organic layer including a light-emitting layer, a second optically transparent and electrically conductive layer and a first optically reflective and electrically conductive layer in order, and second pixels formed over the optically transparent substrate, each of the second pixels including a second organic electro-luminescence element which includes a second optically reflective and electrically conductive layer, the first optically transparent and electrically conductive layer, the organic layer including the light-emitting layer and the second optically transparent and electrically conductive layer in order. Accordingly, the first organic electro-luminescence element and the second organic electro-luminescence element commonly share same layers, thus minimizing the thickness of the device.

20 Claims, 7 Drawing Sheets

U.S. PATENT DOCUMENTS

| | | | |
|---|---|---|---|
| 5,737,042 A * | 4/1998 | Shinohara et al. | 349/57 |
| 6,819,309 B1 * | 11/2004 | Kishi | 345/87 |
| 2001/0004190 A1 * | 6/2001 | Nishi et al. | 313/506 |
| 2001/0048109 A1 * | 12/2001 | Murade | 257/72 |
| 2002/0021266 A1 * | 2/2002 | Koyama et al. | 345/76 |
| 2002/0047567 A1 * | 4/2002 | Fujita et al. | 315/169.3 |
| 2002/0097363 A1 * | 7/2002 | Yudasaka | 349/138 |
| 2002/0117689 A1 * | 8/2002 | Akimoto | 257/214 |
| 2002/0122144 A1 * | 9/2002 | Yoshida et al. | 349/61 |
| 2002/0140343 A1 * | 10/2002 | Hirabayashi | 313/493 |

FOREIGN PATENT DOCUMENTS

| | | |
|---|---|---|
| JP | 08-152619 | 6/1996 |
| JP | 8-152619 A | 6/1996 |
| JP | 2001-027756 A | 1/2001 |
| JP | 2001-305525 A | 10/2001 |
| JP | 2001-332392 | 11/2001 |
| JP | 2003-345271 | 12/2003 |

OTHER PUBLICATIONS

Notification of Reasons for Refusal dated May 12, 2008 for Patent Application No. JP No. 2002-248942.

Supplementary European Search Report for Application No. EP. 03 79 5241 dated. Aug. 6, 2008.

* cited by examiner

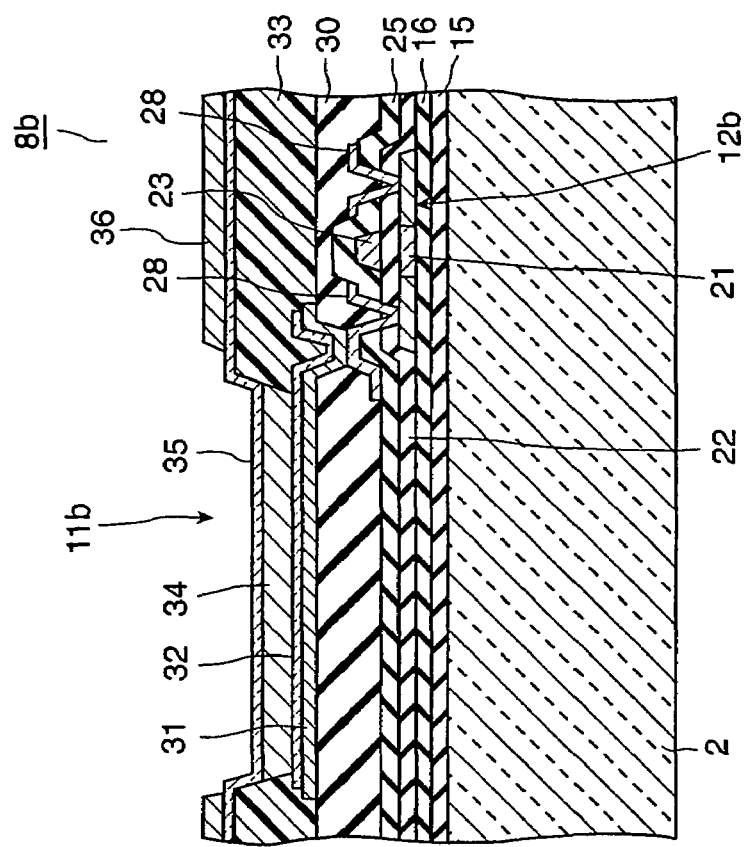
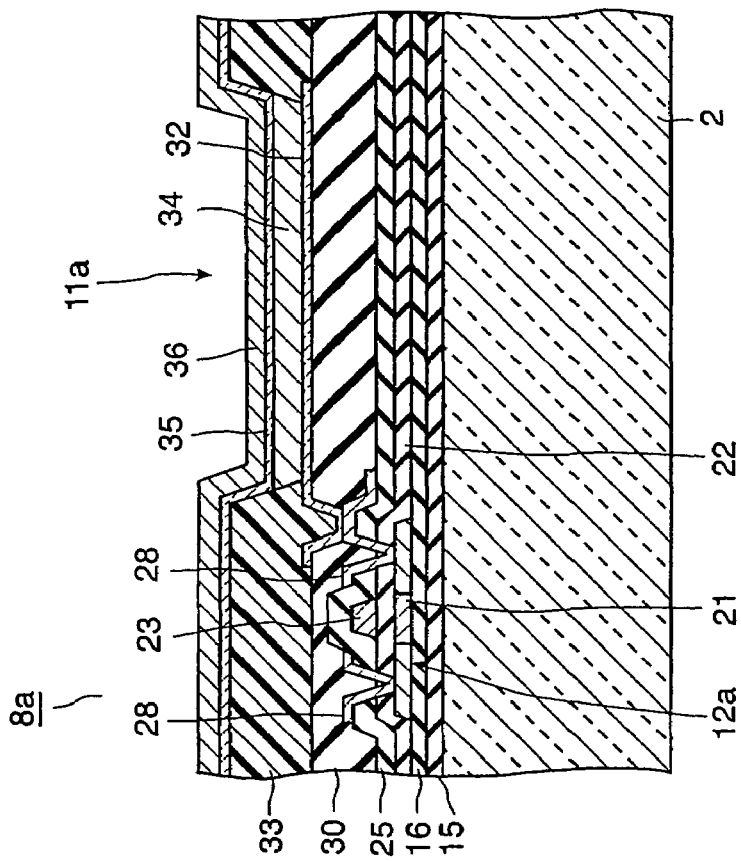
FIG. 3A
FIG. 3B

DEVICE FOR DISPLAYING IMAGES ON ITS FRONT AND BACK SURFACES

CROSS REFERENCE TO RELATED APPLICATION

This is the U.S. National Stage of PCT/JP2003/010850, filed Aug. 27, 2003, which in turn claims priority to Japanese Patent Application No. 2002-248942, filed Aug. 28, 2002, both of which are incorporated herein in their entirety by reference.

TECHNICAL FIELD

This invention generally relates to a display device and, more particularly, to a display device for displaying images on its front and back panels.

BACKGROUND ART

As flat panel display components liquid crystal display (LCD) devices have been primarily used for mobile phones and personal digital assistants. Organic electro-luminescence (EL) display devices have been experimentally installed in such compact electronic equipment because the EL display devices have significant advantages of faster response speeds and wider viewing angles than the LCD devices.

Some folding type mobile phones and handy electronic equipment are provided with a flat panel display device for displaying images in both their folded and unfolded states, i.e., for displaying images on their front and back panels. They are, however, thicker in thickness than those with a one-sided display device. It is quite important for mobile phone, handy electronic equipment, etc. to be sufficiently thin even though they have such a display device as described above.

DISCLOSURE OF INVENTION

An object of the present invention is to provide a thin display device for displaying images on both its front and back panels, which can be installed in handy electronic equipment.

Another object of the present invention is to provide a thin display device capable of displaying different images on both its front and back panels.

According to one aspect of the present invention, a display device comprises an optically transparent substrate, first pixel electrodes formed on the substrate, the first pixel electrodes including light shielding portions, second pixel electrodes formed on the substrate, the second pixel electrodes including optically transparent portions, common electrodes provided with optically transparent portions corresponding to the first pixel electrodes and light shielding portions corresponding to the second pixel electrodes, first optical layers disposed between the first pixel electrodes and the common electrodes to change an optical property in response to electric energy applied between the first pixel electrodes and the common electrodes, and second optical layers disposed between the second pixel electrodes and the common electrodes to change an optical property in response to electric energy applied between the second pixel electrodes and the common electrodes.

The display device set forth above is characterized in that the first and second pixel electrodes are optically reflective on sides facing the common electrodes.

The display device set forth above is still characterized in that the first pixel electrodes are disposed in a first direction, the second pixel electrodes are disposed in a second direction to cross the first pixel electrodes, and the first and second pixel electrodes are alternatively provided in the first and/or second directions.

The display device set forth above further comprises scanning lines disposed in the first direction on the substrate, first and second video signal lines disposed in the second direction on the substrate, first switching elements provided in vicinities of points where the scanning lines cross the first video signal lines, the first switching elements supplying video signals from the first video signal lines between the first pixel electrodes and the common electrodes in response to scanning signals from the scanning lines, and second switching elements provided in vicinities of points where the scanning lines cross the second video signal lines, the second switching elements supplying video signals from the second video signal lines between the second pixel electrodes and the common electrodes in response to scanning signals from the scanning lines.

The display device set forth above is characterized in that at least a part of the first and second switching elements is disposed in a region defined by the substrate and the first pixel electrodes.

The display device set forth above is further characterized in that the number of the first pixel electrodes is different from that of the second pixel electrodes.

The display device set forth above is still further characterized in that the first and second optical layers are provided with organic electro-luminescent light emitting layers.

Electronic equipment of the present invention includes a display device set forth above, and an input manipulator to input signals to the display device, wherein the display device displays images in response to the input.

This patent application is based upon and claims the benefit of priority from the Japanese Patent Application No. 2002-248942, filed on Aug. 28, 2002, the entire contents of which are incorporated herein by reference.

BRIEF DESCRIPTION OF DRAWINGS

A more complete appreciation of the present invention and many of the attendant advantages thereof will be readily obtained as the same becomes better understood by reference to the following detailed descriptions when considered in connection with the accompanying drawings, wherein:

FIGS. 3A and 3B are sectional views cut along IIIA-IIIA and IIIB-IIIB of the display device shown in FIG. 2;

BEST MODE FOR CARRING OUT THE INVENTION

Figure 1:
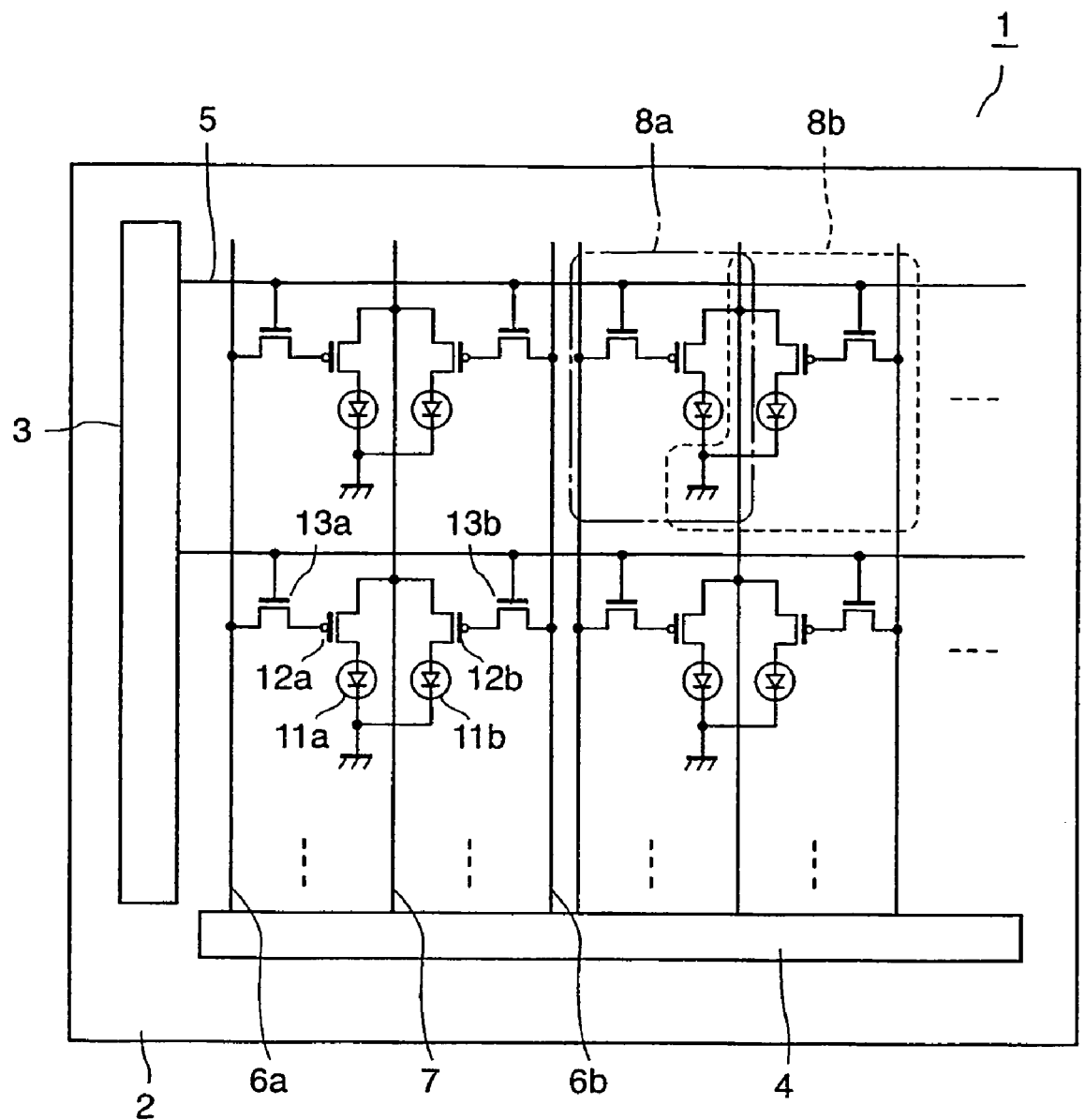
FIG. 1 is a circuit diagram of a display device in accordance with a first embodiment of the present invention.

An embodiment of the present invention will be explained below with reference to the drawings. The same or similar components are indicated by same reference numerals throughout the drawings and redundant explanations about them are omitted.

INDUSTRIAL APPLICABILITY

The present invention is applicable to electronic equipment with a display device.

FIG. 1 a circuit diagram of a display device in accordance with a first embodiment of the present invention. Display device 1 shown in FIG. 1 is an organic EL (electro-luminescence) display device.

This organic EL display device 1 is provided with transparent substrate 2 on which scanning line driver 3 and video signal line driver 4, scanning lines 5, video signal lines 6a and 6b, electrode lines 7 and pixels 8a and 8b are disposed.

Scanning lines 5 extend in line (horizontal) directions of pixels 8a and 8b and are disposed in a row (vertical) direction. Scanning lines 5 each are supplied with scanning signals on a regular basis from scanning line driver 3.

Video signal lines 6a and 6b extend in row (vertical) directions of pixels 8a and 8b and are disposed in line (horizontal) directions. Video signal lines 6a and 6b each are supplied with video signals from video signal line driver 4.

Pixels 8a and 8b are formed in a matrix on transparent substrate 2. In other words, pixels 8a and 8b are provided in line and row directions. As will be described later, pixels 8a and 8b are used to display images on the back and front panels of the display device, respectively.

Pixels 8a each include organic EL elements 11a and thin film transistors 12a and 13a. Transistors 12a are electric current control elements while transistors 13a are pixel selection switches. Pixels 8b each, similar in circuit configurations to pixels 8a, also include organic EL elements 11b, drive control elements 12b and pixel selection switches 13b.

Source and drain electrodes of drive control elements 12a and 12b are connected to electrode lines 7 and anodes of organic EL elements 11a and 11b, respectively. Gate and source electrodes of pixel selection switches 13a and 13b are connected to scanning lines 5 and video signal lines 6a and 6b, respectively. Drain electrodes of pixel selection switches 13a and 13b are connected to gates of drive control elements 12a and 12b, respectively.

Figure 2:
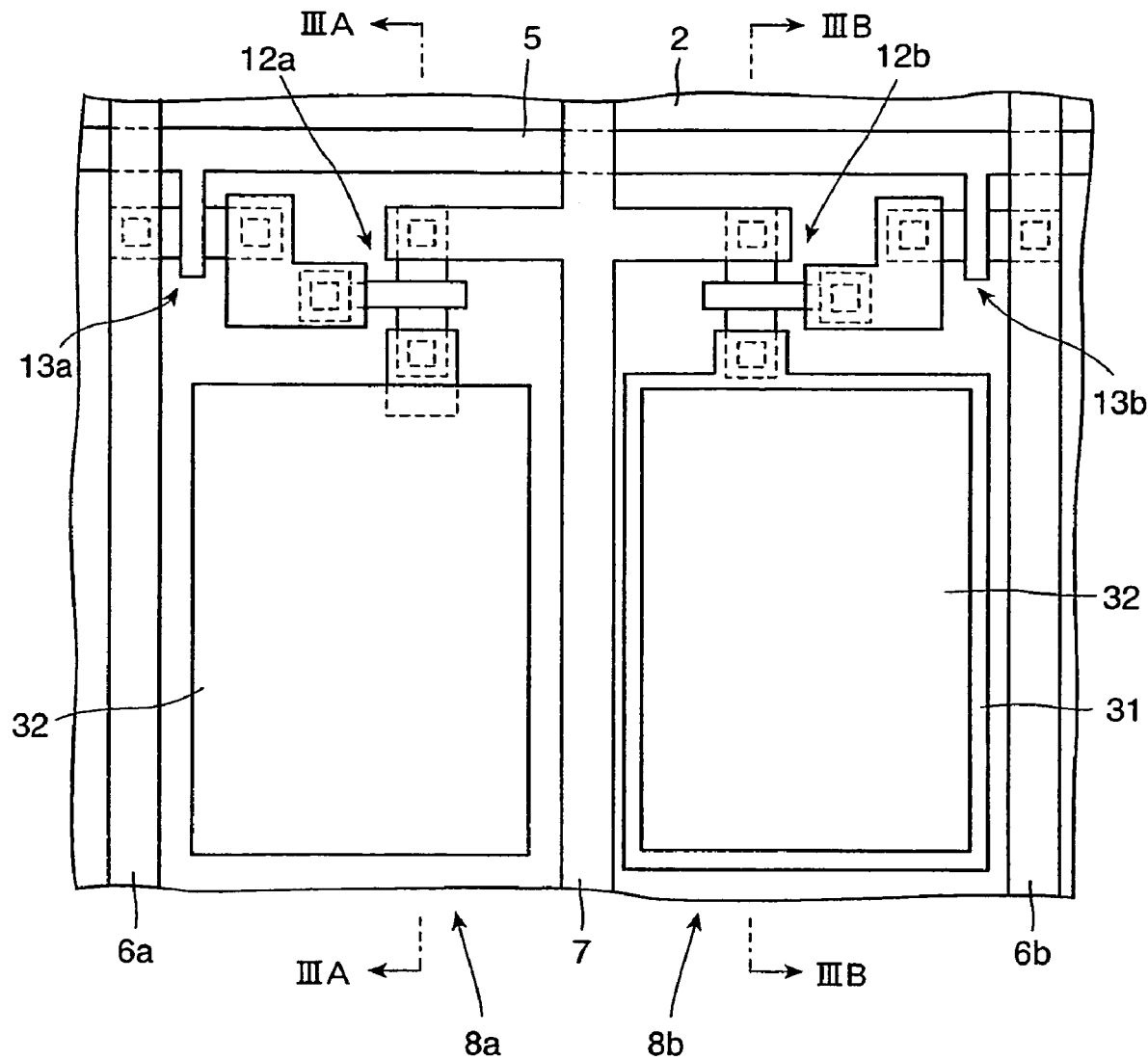
FIG. 2 is a schematic pixel layout diagram of the display device shown in FIG. 1.

FIG. 2 is a plan view of pixels 8a and 8b in the display device shown in FIG. 1. For the sake of simplicity some components are omitted from the display device shown in FIG. 2. FIGS. 3A and 3B are sectional views cut along IIIA-IIIA and IIIB-IIIB of the display device shown in FIG. 2

As shown in FIGS. 2 and 3A and 3B, organic El display device 1 is provided with undercoat layer 16 laminated with silicon nitride ($SiN_x$) and silicon oxide ($SiO_2$) in this order on transparent substrate 2. Semiconductor layer 21 and gate insulation film 22 are formed in this order on undercoat layer 16. Semiconductor layer 21 made of polycrystalline silicon, for instance, includes a channel and source and drain regions. Gate electrodes 23 and scanning lines 5 are provided on gate insulation film 22. Semiconductor layers 21, gate insulation films 22 and gate electrodes 23 constitute top gate type thin film transistors.

Gate insulation film 22, gate electrodes 23 and scanning lines 5 are covered with interlayer film 25 made of silicon oxide ($SiO_2$). Video signal lines 6a and 6b, electrode lines 7, source and drain electrodes 28, etc. are provided on interlayer film 25 but are covered with passivation film 30 made of silicon nitride (SiNx), etc. Source and drain electrodes 28 are connected to the source and drain regions of the thin film transistors, respectively.

Optically reflective and electrically conductive layer 31 and, then, optically transparent and electrically conductive layer 32 are deposited on passivation film 30 in the region corresponding to pixel 8b. On the other hand, optically transparent and electrically conductive layer 32 is only deposited, but optically reflective and electrically conductive layer 31 is not provided, on passivation film 30 in the region corresponding to pixel 8a. Thus, electrically conductive layer 32 constitutes a pixel electrode (anode) of pixel 8a while electrically conductive layers 31 and 32 constitute a pixel electrode (anode) of pixel 8b.

Further, partition insulation layer 33 is provided on passivation film 30. Partition insulation layer 33 is a lamination made of hydrophilic and water repellent layers, for instance. Further, partition insulation layer 33 has an opening to partially expose the upper surface of electrically conductive layer 32.

Organic layer 34 is provided on the upper surface of electrically conductive layer 32 exposed partially by the opening of partition insulation layer 33. Organic layer 34 includes a light-emitting layer primarily made of a red, green or blue organic luminescent compound, for example. Organic layer 34 may additionally include an intermediate layer such as a hole injection layer provided between an electrode and a luminescent layer to inject carriers from the electrode to the luminescent layer.

Optically transparent and electrically conductive layer 35 and optically reflective and electrically conductive layer 36 are formed in this order on partition insulation layer 33 and organic layer 34 as common electrodes. Electrically conductive layers 35 and 36 are electrically connected to their lead lines (not shown) through contact holes (not shown) provided in passivation film 30 and partition insulation layer 33.

Electrically conductive layer 35 is formed entirely on a display area including pixels 8a and 8b as a continuous film. On the other hand, electrically conductive layer 36 is formed entirely on the display area, similarly to electrically conductive layer 35, except its opening corresponding to pixel 8b. In other words, the lamination of electrically conductive layers 35 and 36 and conductive layer 35 constitute cathodes for pixels 8a and 8b, respectively.

As described above, organic EL display device 1 in accordance with the first embodiment of the present invention includes pixels 8a and 8b corresponding to organic EL elements 11a and 11b, respectively. Further, organic EL elements 11a and 11b emit light to the back and front surfaces, respectively. In other words, organic EL element 11a essentially contains the optically transparent anode (electrically conductive layer 32), organic layer 34 and optically reflective cathode (electrically conductive layers 35 and 36) that are laminated in turn. On the other hand, organic EL element 11b essentially contains the optically reflective anode (electrically conductive layers 31 and 32), organic layer 34 and optically transparent cathode (electrically conductive layer 35) that are laminated in turn.

Thus, organic EL display device 1 can display images on both front and back surfaces. A handy electronic terminal with such organic EL display device 1 becomes thin in thickness.

Further, where both the anode and cathode are made optically transparent, images displayed on the front and back panels interfere with each other and cannot be different on them, accordingly. Organic EL display device 1 of the present invention includes, however, both the cathode of pixel 8a and the anode of pixel 8b which are optically reflective, so that different, and high brightness, images can be displayed on the front and back surfaces.

In addition, in organic EL display device 1, pixel 8a is substantially the same in structure as pixel 8b. No additional manufacturing processes are specifically required for the structure to display different images on both the front and back panels.

Still further, electrode lines 7 and video signal line driver 4 are commonly provided for pixels 8a and 8b in organic EL display device 1. Thus, this structure can increase an area ratio of the display area to the driver circuit area including scanning line and video signal line drivers 3 and 4 and achieve to display images with higher brightness.

The front and back panels are not limited to the same but may be different in size, if preferable, by adjusting a number of pixels for them.

Now, components of organic EL display device 1 will be explained below in detail. Transparent substrate 2 can be any material that supports the structure formed on it. A hard substrate such as a glass plate is generally used for transparent substrate 2 but flexible substrates made of plastics can be used for it depending on the applications of organic EL display device 1.

Electrically conductive layer 31 can be made of metal materials, e.g., gold, silver, platinum, palladium. Electrically conductive layer 32, however, is made of optically transparent but electrically conductive materials, e.g., transparent electrically conductive oxidized metals of indium-tin-oxide (ITO), indium-zinc-oxide (IZO), and the like. Electrically conductive layers 31 and 32 are formed by applying a deposition method of vacuum evaporation, sputtering, or the like and a well known photo-lithographic patterning technique. Electrically conductive layers 31 and 32 can be also made by using a masked sputtering method.

Partition insulation layer 33 may be either a single water repellent layer or a lamination of hydrophilic and water repellent layers. The latter structure provides organic layer 34 with higher positioning or shaping accuracy than the former one.

The hydrophilic layer of partition insulation layer 33 may be made of inorganic insulation materials such as. silicon nitride or silicon oxide. The inorganic insulation material exhibits a considerably high hydrophilic property. The water repellent layer of partition insulation layer 33 may be made of organic materials such as a photosensitive resin.

Organic layer 34 includes a light-emitting layer, as described above, but it may be a multiple-layer structure further arbitrarily including a hole injection layer. In that case, the hole injection layer is provided between the light emitting layer and the anode.

Where a composition primarily containing donor and acceptor materials is used for the hole injection layer, it can be an organic polymer compound for donors and that for acceptors. The organic polymer compound for donors is a polythiophene derivative such as polyethylene dioxithiophene or a polyaniline derivative such as polyaniline while the that for acceptors is polystyrene sulfonic acid, for instance.

The hole injection layer is made by the following steps: filling, by a solution coating method, liquid collectors are formed by partition insulation layer 33 with a solution dissolving a mixture of organic polymer compounds for donors and acceptors, drying liquid membranes in the liquid collectors and removing solvents from the membranes. The solution coating method useful to make the hole injection layer is based upon vapor deposition, spin coating, or ink jet, for example.

Light emitting layer materials can be luminescent organic compounds generally used for organic EL display devices. For example, a red light emitting layer material is a polymer compound having an alkyl or alkoxy substituent in a benzene ring of a polyvinylene styrene derivative or that having vinylene or cyano group of a polyvinylene styrene derivative. A green light emitting layer material is a polyvinylene styrene derivative introducing an alkyl, alkoxy or allylic derivative substituent into its benzene ring. A blue light emitting layer material is a polyfluorene derivative such as a copolymer of dialkylfluorene and althracen. A method of making the light-emitting layer is similar to that of making the hole injection layer as described above. The light emitting layer and hole injection layer can be also made of low molecular system materials.

An optically transparent but electrically conductive layer such as a thin lithium fluoride (LiF) layer can be used for electrically conductive layer 35. In addition, a relatively thick metal layer such as an aluminum (Al) or silver (Ag) layer can be used for electrically conductive layer 36. Electrically conductive layers 35 and 36 are formed by vapor depositing or sputtering the conductive material and by using a lithographic technique to pattern such deposited or sputtered conductive material. Further, electrically conductive layers 35 and 36 can be made by applying a masked sputtering method.

Electrically conductive layers 35 and 36 may be coated with a transparent protection film. A sealing substrate may be provided opposite to the surface on which organic EL elements 11a and 11b of transparent substrate 2 are formed and a sealant layer is made around peripheral edge portions of facing inner surfaces of the sealing substrate and organic EL elements 11a and 11b of transparent substrate 2 to define a hollow structure. The hollow space may be filled with a rare gas such as argon (Ar) gas or an inert gas such as nitride ($N_2$) gas, a desiccant material or a resin.

Figure 4:
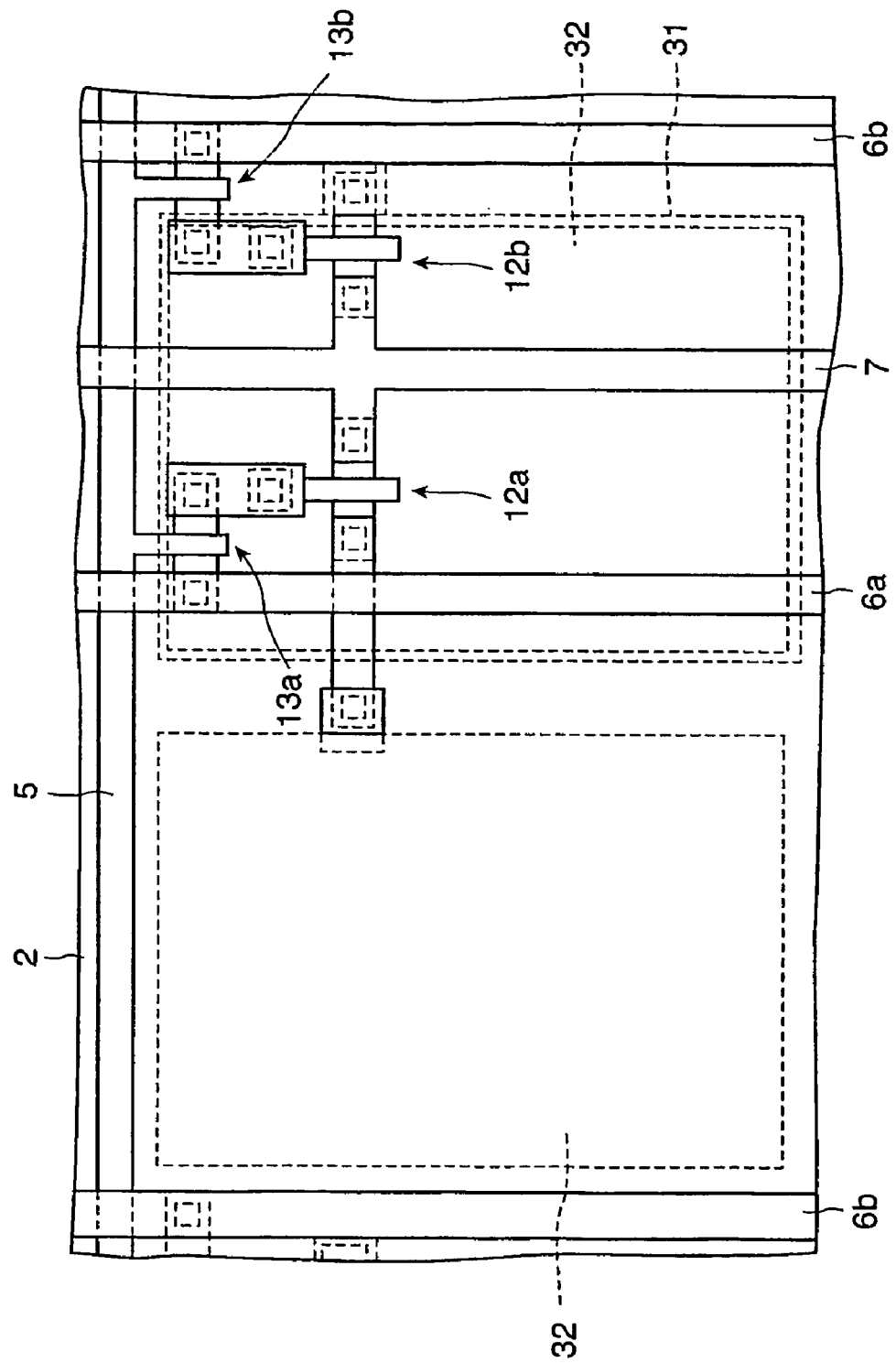
FIG. 4 is a schematic pixel layout diagram of a display device in accordance with a second embodiment of the present invention.

A second embodiment of the present invention will be explained below. FIG. 4 is a pixel layout of a flat panel display device in accordance with the second embodiment of the invention. Similarly to the first embodiment, the flat panel display device is an organic EL display device. Its circuit arrangements and sectional view are substantially equal to the first embodiment.

As shown in FIG. 4, drive control elements 12a and 12b, pixel selection switch 13a, a part of pixel selection switch 13b, video signal line 6a and electrode line 7 are disposed in a region defined between electrically conductive layer 31 and transparent substrate 2. In other words, the drive control elements, the pixel switches, etc. are provided to overlap an upper surface of light emitting pixels. Its layout is substantially the same as that of the first embodiment except the arrangements described immediately above. The layout shown in FIG. 4 increases its light-emitting area to be greater than the one shown in FIG. 2. Thus, it can provide a flat panel display device of better display quality.

The flat panel display devices in accordance with the first and second embodiments are applicable to various electronic equipment such as mobile phones, personal digital assistants (PDAs), notebook or desktop type personal computers, handy electronic equipment like game machines and fixed electronic apparatus.

Figures 5A, 5B:
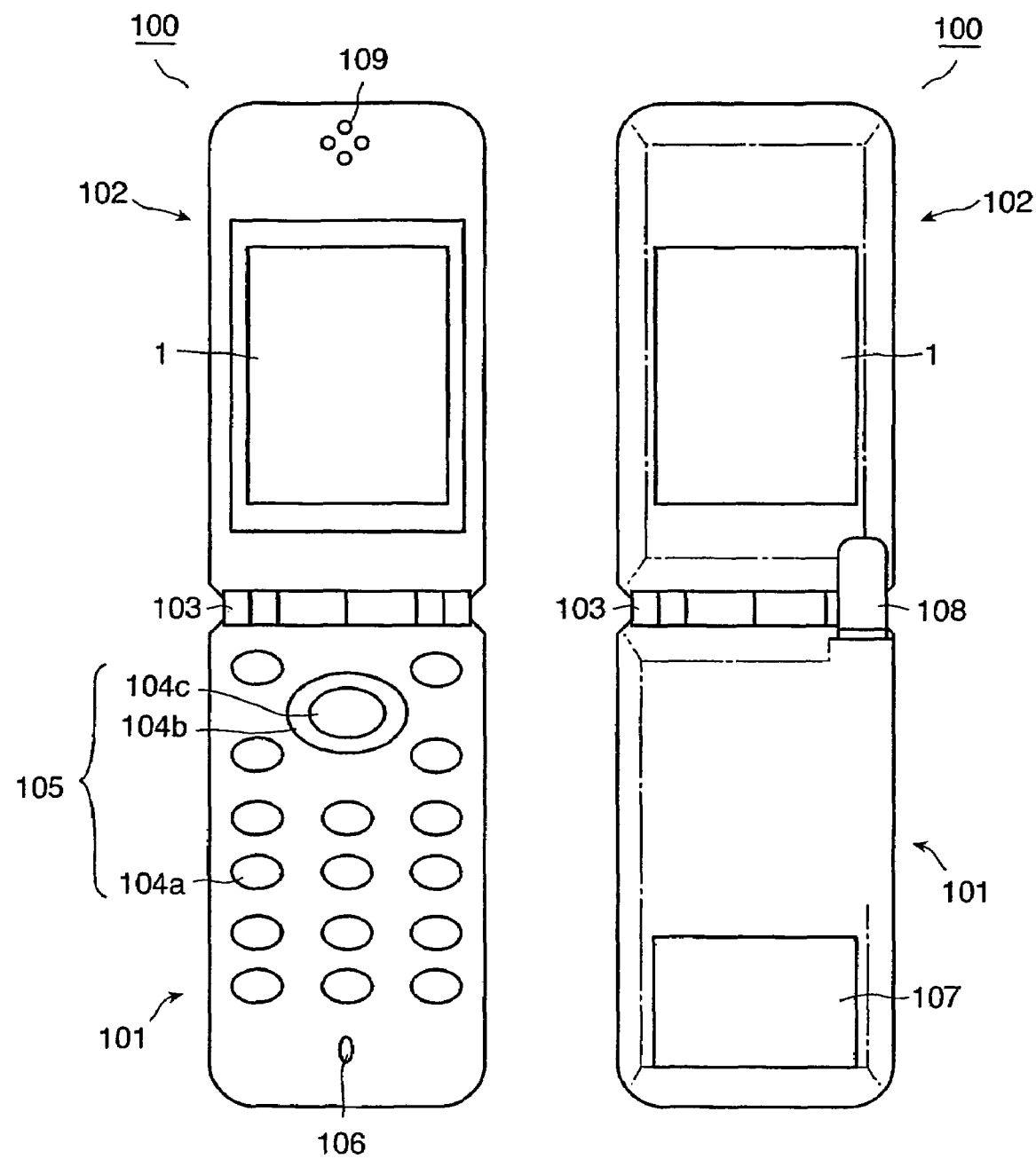
FIG. 5A is a plan view of the front panel of a mobile phone provided with the display device in accordance with the first or second embodiment of the invention.
FIG. 5B is a plan view of the back panel of the mobile phone shown in FIG. 5A.

FIGS. 5A and 5B are plan views of the unfolded front and back of a mobile phone, respectively, in which the organic EL flat panel display device in accordance with the first or second embodiment is installed.

Folding type mobile phone 100 shown in FIGS. 5A and 5B has lower and upper portions 101 and 102. Lower portion 101 is connected to upper portion 102 through connecting portion 103. Lower and upper portions 101 and 102 are rotary about an axis of connection portion 103 to be folded or unfolded.

The front of lower portion 101 is provided with input unit 105 of input keys 104*a*, 104*b* and 104*c* as a user input interface, an aperture 106 to send an audio signal to a transmitter to transduce acoustic energy to electric energy, etc. The back of lower portion 101 is provided with a lid for a battery box 107, an expandable antenna 108, etc.

The front and back of upper portion 102 are provided with flat panel display device 1 in accordance with the first or second embodiment of the present invention. The front of upper portion 102 has a window to receive a display surface of flat panel display device 1 and to make images of the display surface visible, an aperture 109 for a receiver to transduce electric energy to audio energy, etc. The back of upper portion 102 has a window to receive another display surface of flat panel display device 1, etc.

Since organic EL flat panel display device 1 is installed in the folding type mobile phone 100, images can be displayed on both the front and back. Thus, the folding type mobile phone 100 has one display device, (organic EL flat panel display device 1) with main and sub-display panels and yet its thickness can be equal to an organic EL flat panel display device with one display panel so that a possible thickness increase due to a structure of front and back panels can be effectively avoided.

Further, organic EL flat panel display device 1 significantly achieves reduction in material costs, and increase in mechanical strength due to reduction as to the number of lines in comparison with separately provided and conventional main and sub-flat panel display devices.

Figures 6A, 6B:
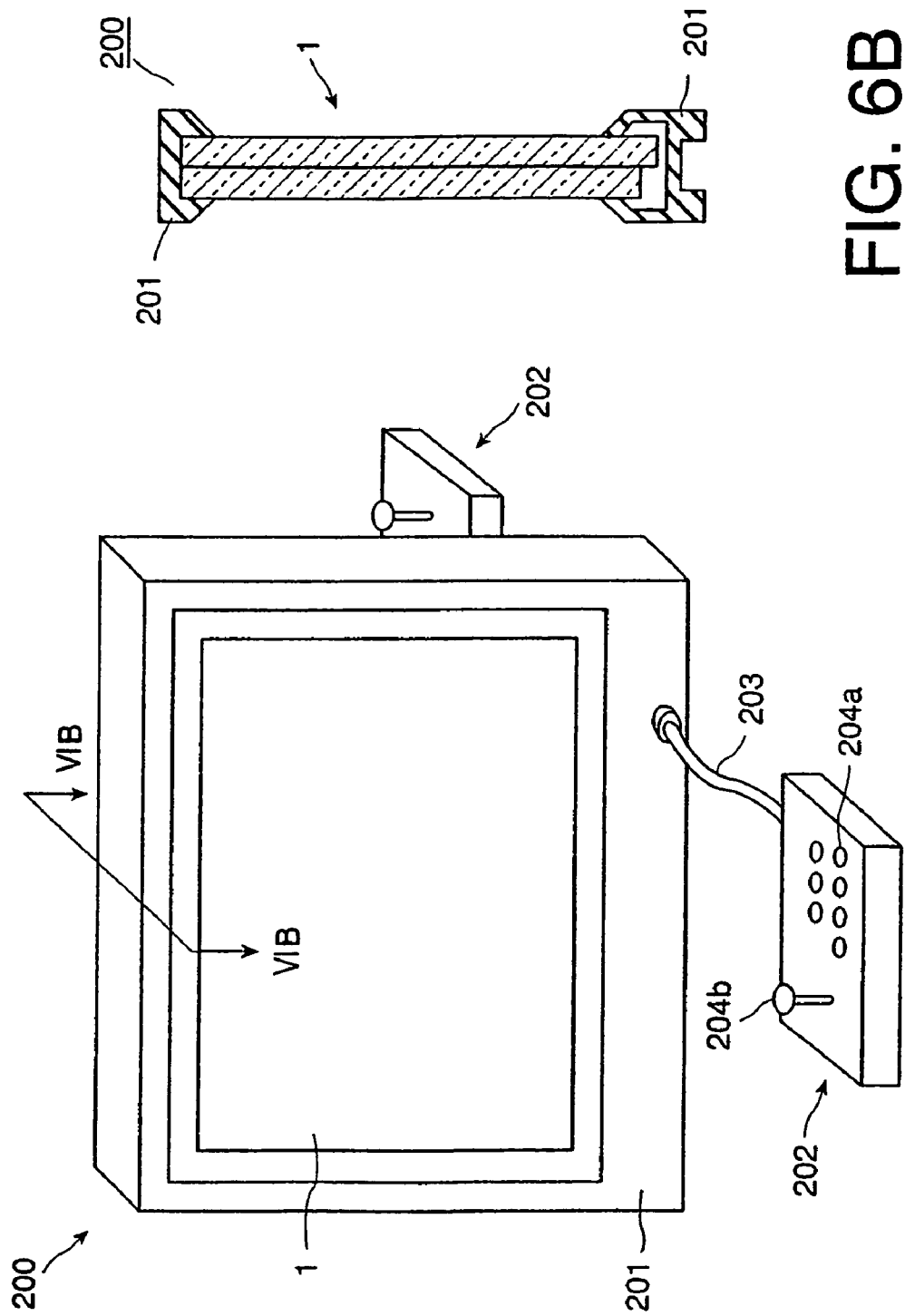
FIG. 6A is a perspective view of a game machine provided with the display device in accordance with the first or second embodiment of the invention.
FIG. 6B is a sectional view cut along VIB-VIB of the game machine shown in FIG. 6A.

FIGS. 6A is a perspective view of a game machine in which flat panel display 1 in accordance with the first or second embodiment of the invention is installed while FIG. 6B is a sectional view cut along line VIB-VIB of the game machine. The game machine shown in FIGS. 6A and 6B is a confronting type one provided with main body unit 200, a pair of input manipulators 202, and cables 203 to connect input manipulators 202 to main body unit 200.

Main body unit 200 includes frame 201 which holds flat panel display device 1 and receives signal processing units, speakers, etc. in its inside (not shown). Input manipulators 202 each include input buttons 204*a* and lever 204*b*. In the game machine, when a user operates input button 204*a* or lever 204*b*, input manipulator 202 supplies signals to the signal-processing unit. The signal-processing unit processes the signals in accordance with pre-stored programs and supplies video and audio signals to flat panel display device 1 and the speakers, respectively. In this way, flat panel display device 1 displays images and the speakers output audio signals in response to such user's operation.

Where flat panel display device 1 is installed in electronic equipment like this game machine, it makes the equipment compact in addition to the advantages set forth above.

Although, in the first and second embodiments, the cathode of organic EL element 11*a* and the anode of organic EL element 11*b* are optically reflective, it is not always necessary to make them optically reflective but it is enough that they shield light. Thus, they can be optically absorptive. From the viewpoint of brightness, however, it is advantageous to make them optically reflective.

Figure 7:
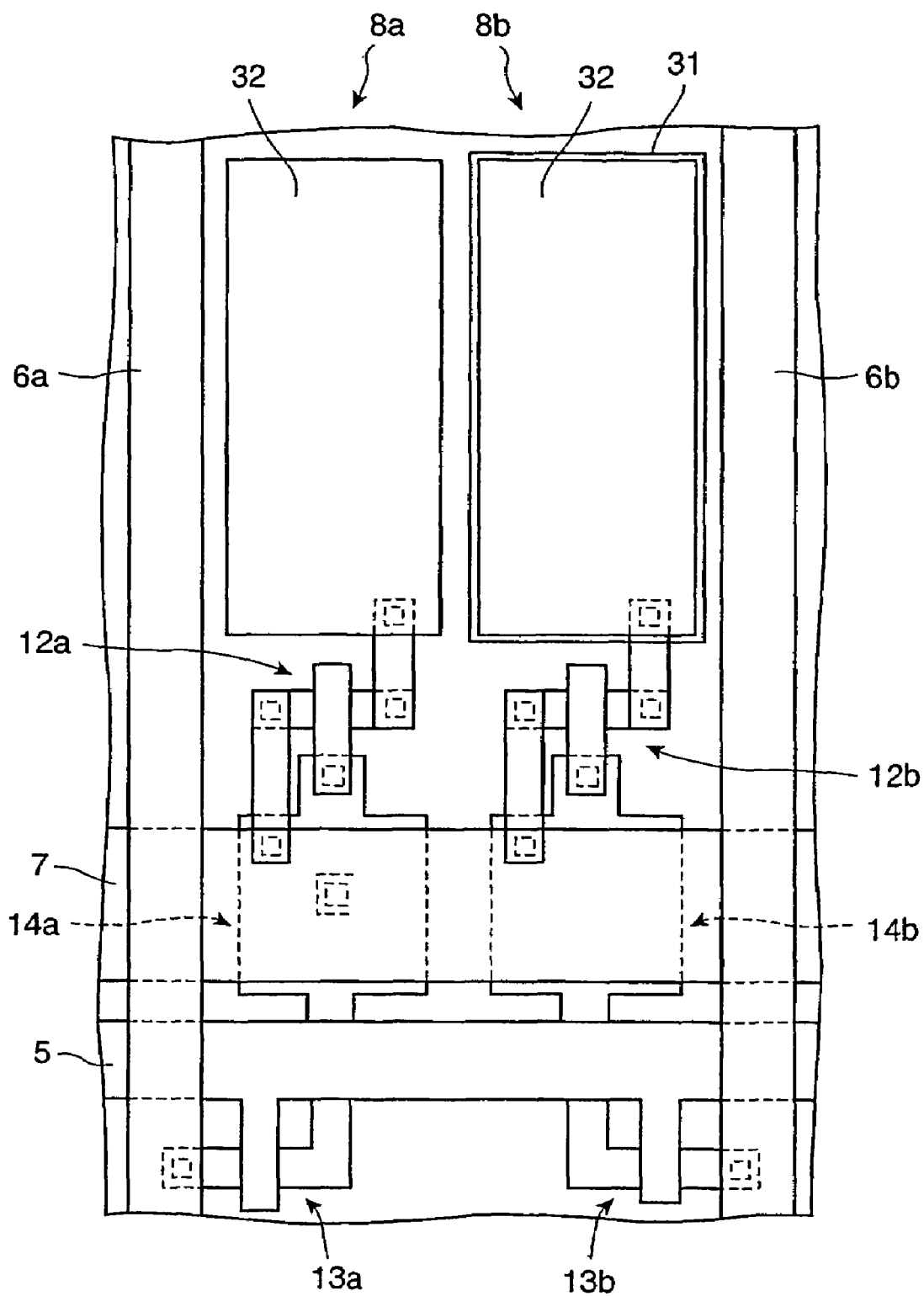
FIG. 7 is a schematic pixel layout diagram of a display device in accordance with third embodiment of the present invention.

Further, it is possible to adopt other circuit arrangements than those shown in FIG. 1 as the first and second embodiments. Electric capacitors, for instance, can be additionally provided to hold gate potentials of drive control elements 12*a* and 12*b* shown in FIG. 1. Although electrode lines 7 are disposed substantially in parallel with video signal lines 6*a* and 6*b* as shown in FIGS. 1, 2 and 4, they can be provided substantially in parallel with scanning lines 5. In addition, as shown in FIG. 7, for instance, electrode lines 7 are disposed substantially in parallel with scanning lines 5 while electric capacitors 14*a* and 14*b* are provided to hold gate potentials of drive control elements 12*a* and 12*b*. Threshold cancel circuits can be further provided to adjust dispersion in threshold voltages of drive control elements 12*a* and 12*b*.

Video signal line driver 4 is commonly used for pixels 8*a* and 8*b* in the first and second embodiments but video signal line drivers for pixels 8*a* and 8*b* can be separately provided for the front and back panels, respectively. The video signal line drivers are integrated on transparent substrate 2 as shown in the first and second embodiments but they can be formed outside transparent substrate 2, e.g., in a tape carrier package or the like.

Electrode lines 7 are provided commonly for pixels 8*a* and 8*b* in the first and second embodiments but electrode lines can be separately provided for them, respectively.

In the first and second embodiments, organic EL elements 11*a* and 11*b* are driven independently but neighboring organic EL elements 11*a* and 11*b* can be connected to each other (organic EL elements 11*a* and 11*b* can be connected, for instance, in parallel with each other) to always display identical images on both the front and back panels. In the latter case, some circuits are commonly used in each pixel. For instance, each pixel consists of organic EL elements 11*a* and 11*b*, drive control element 12*a* and pixel selection switch 13*a* but video signal line 6*b*, drive control element 12*b* or pixel switch 13*b* is not needed for it.

Where this structure is adopted for organic EL flat panel display device 1, the front and back panels display mirror images. Flat panel display devices installed in a game machine have no problems in displaying such mirror images in so far as they display no characters. The front and back panels of a flat panel display device each can be provided with independent display portions for mirror and identical images.

There are few necessities for electronic equipment such as folding type mobile phones and notebook type personal computers to simultaneously display independent images on the front and back panels. Thus, when the equipment is folded or closed, its front panel displays images but, alternatively, when it is unfolded or opened, its back panel displays them. In short, signal processing is carried out to display right images in both situations.

The present invention is practiced not only for the organic EL flat panel display devices as explained in the first and second embodiments but also for other display devices, such as liquid crystal display devices provided with reflective pixels for the front and back panels in a matrix, respectively.

As described above, a display device according to the present invention includes first light shielding pixel electrodes and second optically transparent pixel electrodes formed on a substrate in parallel with each other and common electrodes are provided with optically transparent portions corresponding to the first pixel electrodes and light shielding portions corresponding to the second pixel electrodes. As a result, images can be displayed on both surfaces of the display device without increase in thickness. In other words, the present invention provides a display device installed in electronic equipment which is thin in thickness and capable of displaying images on both the front and back surfaces.

The invention claimed is:

1. An organic electro-luminescence display device comprising:
   an optically transparent substrate;
   first pixels formed over the optically transparent substrate, each of the first pixels including a first organic electro-luminescence element which includes a first optically transparent and electrically conductive layer, an organic layer including a light-emitting layer, a second optically transparent and electrically conductive layer, and a first optically reflective and electrically conductive layer in order,
      the organic layer configured to transform electric energy applied between the first optically transparent and electrically conductive layer and the second optically transparent and electrically conductive layer into light,
      the first optically reflective and electrically conductive layer configured to reflect light, and
      the first pixel configured to emit light towards a first surface of the organic electro-luminescence display device; and
   second pixels formed over the optically transparent substrate, each of the second pixels including a second organic electro-luminescence element which includes a second optically reflective and electrically conductive layer, the first optically transparent and electrically conductive layer, the organic layer including the light-emitting layer, and the second optically transparent and electrically conductive layer in order,
      the second optically reflective and electrically conductive layer configured to reflect light, and
      the second pixel configured to emit light towards a second surface of the organic electro-luminescence display device, the second surface being opposite to the first surface.

2. The organic electro-luminescence display device according to claim 1, further comprising:
   a first selection switch and a first control element disposed in the first pixel, the first selection switch selecting the first pixel, and the first control element controlling electrical current supplied to the first organic electro-luminescence element; and
   a second selection switch and a second control element disposed in the second pixel, the second selection switch selecting the second pixel, and the second control element controlling electrical current supplied to the second organic electro-luminescence element.

3. The organic electro-luminescence display device according to claim 2, wherein
   each of the first selection switch, the first control element, the second selection switch and the second control element is constituted with a thin film transistor.

4. The organic electro-luminescence display device according to claim 2, further comprising:
   an undercoat layer formed on the optically transparent substrate, the first selection switch, the first control element, the second selection switch and the second control element being formed on the undercoat layer;
   a passivation layer covering the first selection switch, the first control element, the second selection switch and the second control element, and the first organic electro-luminescence element and the second organic electro-luminescence element being on the passivation layer; and
   a partition insulation later formed on the passivation layer, the partition insulation later isolating between the first organic electro-luminescence element and the second organic electro-luminescence element.

5. The organic electro-luminescence display device according to claim 4, wherein
   the undercoat layer is laminated with silicon nitride and silicon oxide in order.

6. The organic electro-luminescence display device according to claim 4, wherein
   the partition insulation later is laminated with a hydrophilic layer and a water repellent layer in order.

7. The organic electro-luminescence display device according to claim 1, wherein
   a hole injection layer is included in the organic layer and is formed between the light-emitting layer and the first optically transparent and electrically conductive layer.

8. The organic electro-luminescence display device according to claim 7, wherein
   a composition containing donor and acceptor constitutes the hole injection layer.

9. The organic electro-luminescence display device according to claim 8, wherein
   the composition containing donor and acceptor contains at least one of a polythiophene derivative such as polyethylene dioxithiophone, a polyaniline derivative such as polyaniline or a polystyrene sulfonic acid.

10. The organic electro-luminescence display device according to claim 1, wherein
   the light-emitting layer is constituted with at least one of a polymer compound having an alkyl or alkoxy substituent in a benzene ring of a polyvinylene styrene derivative, a polymer compound having vinylene or cyano group of a polyvinylene styrene derivative a polyvinylene styrene derivative introducing an alkyl, alkoxy or allylic derivative substituent into its benzene ring or a polyfluorene derivative such as a copolymer of dialkylfluorene and althracen.

11. Electronic equipment comprising:
   an organic electro-luminescence display device as set forth in claim 1; and
   an input manipulator to input signals to the organic electro-luminescence display device,
   wherein the organic electro-luminescence display device displays images in response to the input.

12. An organic electro-luminescence display device comprising:
   an optically transparent substrate;
   first pixels formed over the optically transparent substrate, the first pixels being disposed in a first direction, each of the first pixels including a first organic electro- luminescence element, a first selection switch, and a first control element, the first selection switch selecting the first pixel, the first control element controlling electrical current supplied to the first organic electro-luminescence element;
   second pixels formed over the optically transparent substrate, the second pixels being disposed in the first direction, each of the second pixels including a second organic electro-luminescence element, a second selection switch and a second control element, the second selection switch selecting the second pixel, the second control element controlling electrical current supplied to the second organic electro-luminescence element; and electrode lines disposed in the first line, each of the electrode line being interposed between the first control element and the second control element, the electrode line being commonly connected to the first organic electro-luminescence element via the first control element and the second organic electro-luminescence element via the second control element;

wherein the first organic electro-luminescence element includes a first optically transparent and electrically conductive layer, an organic layer including a light-emitting layer, a second optically transparent and electrically conductive layer and a first optically reflective and electrically conductive layer in order, the organic layer configured to transform electric energy applied between the first optically transparent and electrically conductive layer and the second optically transparent and electrically conductive layer into light, the first optically reflective and electrically conductive layer configured to reflect light, and the first pixel configured to emit light towards a first surface of the organic electro-luminescence display device, the second organic electro-luminescence element is laminated with a second optically reflective and electrically conductive layer, the first optically transparent and electrically conductive layer, the organic layer including the light-emitting layer and the second optically transparent and electrically conductive layer in order, and the second optically reflective and electrically conductive layer configured to reflect light, and the second pixel configured to emit light towards a second surface of the organic electro-luminescence display device, the second surface being opposite to the first surface.

13. The organic electro-luminescence display device according to claim 12, wherein the electrode line is interposed between the first organic electro-luminescence element and the second organic electro-luminescence element; and the first selection switch and the first control element are disposed in a first region being different to the first organic electro-luminescence element in plane and the second selection switch and the second control element are disposed in a second region being different to the second organic electro-luminescence element in plane.

14. The organic electro-luminescence display device according to claim 12, wherein at least one of a portion of the first selection switch, a portion of the first control element, a portion of the second selection switch or a portion of the second control element is overlapped with the second organic electro-luminescence element in plane.

15. The organic electro-luminescence display device according to claim 12, further comprising:

scanning lines disposed in the first direction over the optically transparent substrate; and first video signal lines and second video signal lines disposed in the second direction over the optically transparent substrate;

wherein the first selection switch supply video signals from the first video signal lines between the first optically transparent and electrically conductive layer and the second optically transparent and electrically conductive layer into light in response to scanning signals from the scanning lines, and the second selection switch supply video signals from the second video signal lines between the first optically transparent and electrically conductive layer and the second optically transparent and electrically conductive layer into light in response to scanning signals from the scanning lines.

16. Electronic equipment comprising:

an organic electro-luminescence display device as set forth in claim 12; and an input manipulator to input signals to the organic electro-luminescence display device, wherein the organic electro-luminescence display device displays images in response to the input.

17. An organic electro-luminescence display device comprising:

an optically transparent substrate;

first pixels formed over the optically transparent substrate, the first pixels being disposed in a first direction, each of the first pixels including a first organic electro-luminescence element, a first selection switch, a first control element and a first capacitor, the first selection switch selecting the first pixel, the first control element controlling electrical current supplied to the first organic electro-luminescence element and the first capacitor retaining gate voltage applied to the first control element;

second pixels formed over the optically transparent substrate, the second pixels being disposed in the first direction, each of the second pixels including a second organic electro-luminescence element, a second selection switch, a second control element, and a second capacitor, the second selection switch selecting the second pixel, the second control element controlling electrical current supplied to the second organic electro-luminescence element and the second capacitor retaining gate voltage of the second control element; and electrode lines disposed in the second line, each of the electrode line being commonly connected to the first organic electro-luminescence element via the first control element and the second organic electro-luminescence element via the second control element;

wherein the first organic electro-luminescence element includes a first optically transparent and electrically conductive layer, an organic layer including a light-emitting layer, a second optically transparent and electrically conductive layer and a first optically reflective and electrically conductive layer in order, the organic layer configured to transform electric energy applied between the first optically transparent and electrically conductive layer and the second optically transparent and electrically conductive layer into light, the first optically reflective and electrically conductive layer configured to reflect light, and the first pixel configured to emit light towards a first surface of the organic electro-luminescence display device, the second organic electro-lurninescence element includes a second optically reflective and electrically conductive layer, the first optically transparent and electrically conductive layer, the organic layer including the light-emitting layer and the second optically transparent and electrically conductive layer in order, and the second optically reflective and electrically conductive layer configured to reflect light, and the second pixel configured to emit light towards a second surface of the organic electro-luminescence display device, the second surface being opposite to the first surface.

18. The organic electro-luminescence display device according to claim 17, wherein the first selection switch and the first control element are disposed in a first region being different to the first organic electro-luminescence element in plane and the second selection switch and the second control element are disposed in a second region being different to the second organic electro-luminescence element in plane.

19. The organic electro-luminescence display device according to claim 17, wherein
at least one of a portion of the first selection switch, a portion of the first control element, a portion of the second selection switch or a portion of the second control element is overlapped with the second organic electro-luminescence element in plane.

20. Electronic equipment comprising:
an organic electro-luminescence display device as set forth in claim 17; and
an input manipulator to input signals to the organic electro-luminescence display device,
wherein the organic electro-luminescence display device displays images in response to the input.

* * * * *